US011189524B2

(12) United States Patent
Tien et al.

(10) Patent No.: US 11,189,524 B2
(45) Date of Patent: Nov. 30, 2021

(54) SEMICONDUCTOR ARRANGEMENT AND METHOD OF MAKING

(71) Applicant: TAIWAN SEMICONDUCTOR MANUFACTURING COMPANY LIMITED, Hsin-Chu (TW)

(72) Inventors: Hsi-Wen Tien, Xinfeng Twonship (TW); Wei-Hao Liao, Taichung (TW); Pin-Ren Dai, Taipei (TW); Chih Wei Lu, Hsinchu (TW); Chung-Ju Lee, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/837,087

(22) Filed: Apr. 1, 2020

(65) Prior Publication Data
US 2021/0313221 A1   Oct. 7, 2021

(51) Int. Cl.
*H01L 21/768* (2006.01)
*H01L 23/522* (2006.01)
*H01L 21/3213* (2006.01)
*H01L 21/311* (2006.01)

(52) U.S. Cl.
CPC .. *H01L 21/76807* (2013.01); *H01L 21/76829* (2013.01); *H01L 21/76877* (2013.01); *H01L 23/5226* (2013.01); *H01L 21/31116* (2013.01); *H01L 21/31144* (2013.01); *H01L 21/32136* (2013.01); *H01L 21/32139* (2013.01); *H01L 2221/1031* (2013.01)

(58) Field of Classification Search
CPC ......... H01L 21/76807; H01L 21/76829; H01L 23/5226; H01L 21/76877; H01L 21/31144; H01L 21/32136; H01L 21/32139; H01L 21/31116; H01L 2221/1031
See application file for complete search history.

(56) References Cited

U.S. PATENT DOCUMENTS

2014/0035142 A1* 2/2014 Yang ................. H01L 21/76831
257/751
2021/0017643 A1* 1/2021 Kanakasabapathy .......................
H01L 21/31122

* cited by examiner

*Primary Examiner* — Karen Kusumakar
(74) *Attorney, Agent, or Firm* — Cooper Legal Group, LLC

(57) ABSTRACT

A semiconductor arrangement is provided. The semiconductor arrangement includes a first dielectric layer over a substrate, a metal layer over the first dielectric layer, a first conductive structure passing through the metal layer and the first dielectric layer, a second conductive structure passing through the metal layer and the first dielectric layer, and a third conductive structure coupling the first conductive structure to the second conductive structure, and overlying a first portion of the metal layer between the first conductive structure and the second conductive structure, wherein an interface exists between the metal layer and at least one of the first conductive structure or the second conductive structure.

20 Claims, 11 Drawing Sheets

SEMICONDUCTOR ARRANGEMENT AND METHOD OF MAKING

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
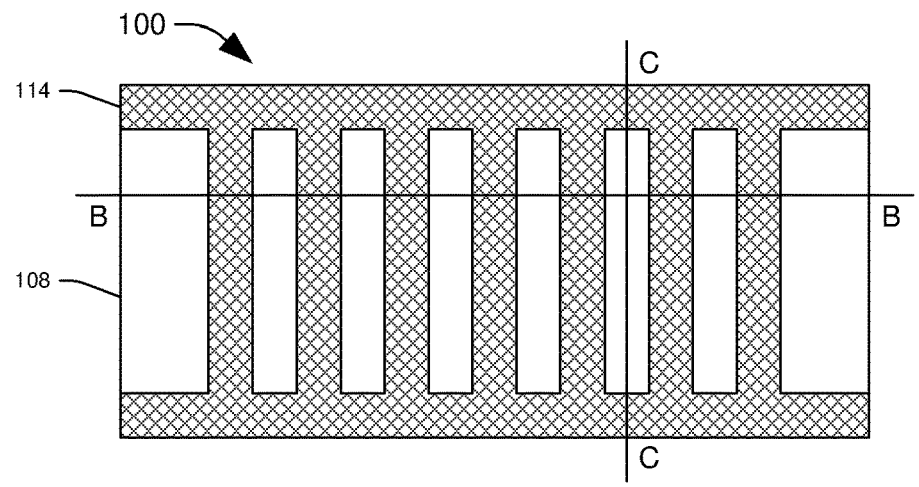
FIGS. 1A-1C illustrate a semiconductor arrangement at a stage of fabrication, in accordance with some embodiments.
Figure 1B:
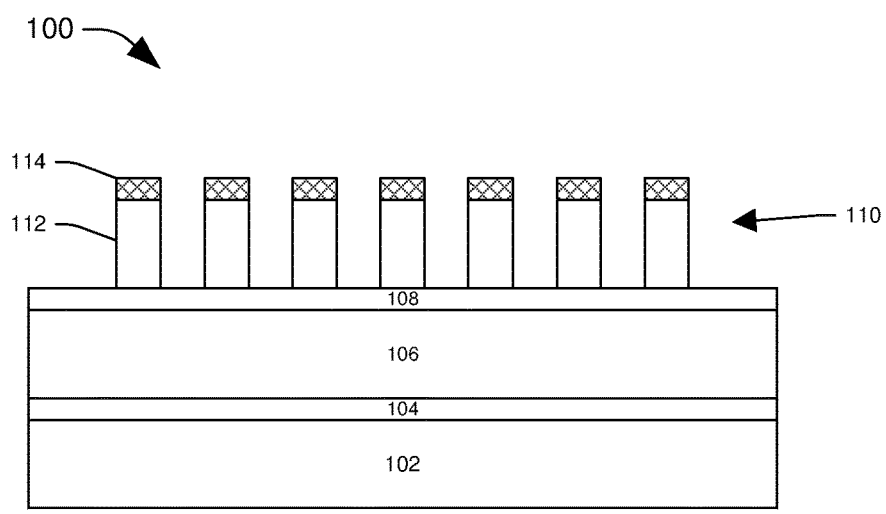
Figure 1C:
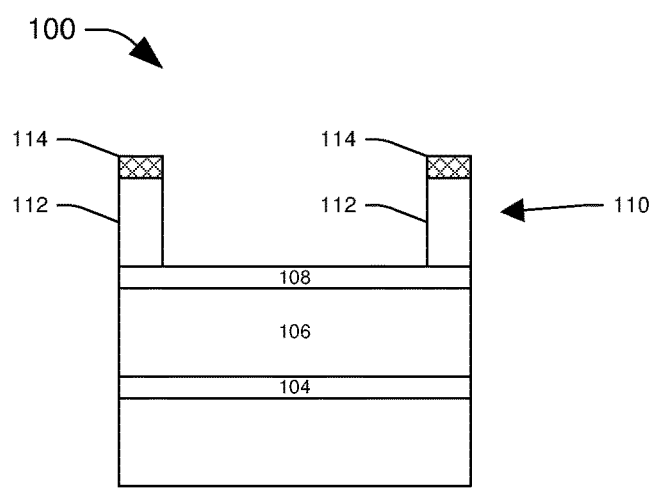

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

Some embodiments relate to a semiconductor arrangement. In accordance with some embodiments, the semiconductor arrangement includes an etch stop layer (ESL) over a substrate, a first dielectric layer over the ESL, a metal layer over the first dielectric layer, and a first conductive structure passing through the metal layer, the first dielectric layer, and the ESL. In some embodiments, the semiconductor arrangement includes a second conductive structure passing through the metal layer, the first dielectric layer, and the ESL. In some embodiments, the semiconductor arrangement includes a third conductive structure coupling the first conductive structure to the second conductive structure. In some embodiments, a first portion of the metal layer is between the first conductive structure and the second conductive structure. In some embodiments, the third conductive structure overlies the first portion of the metal layer.

According to some embodiments, the semiconductor arrangement includes a second dielectric layer overlying the third conductive structure. According to some embodiments, the second dielectric layer overlies the first dielectric layer. In some embodiments, a sidewall of the second dielectric layer is adjacent a sidewall of the third conductive structure and a sidewall of the metal layer. In some embodiments, the third conductive structure overlies a second portion of the metal layer that is not between the first conductive structure and the second conductive structure.

According to some embodiments, the first dielectric layer includes a low-k dielectric material having a dielectric constant of about 1.8 to about 5. According to some embodiments, the metal layer protects at least the first dielectric layer during one or more etching processes, such as by having a different etch selectivity to one or more etchants as compared to other layers, features, etc. According to some embodiments, one or more characteristics, such as lattice structure, dielectric constant value, etc., of the first dielectric layer experience little to no change from the one or more etching processes due to the protection afforded by the metal layer. According to some embodiments, sidewalls, corners, edges, etc. of the first dielectric layer experience little to no rounding, non-linearity, etc. from the one or more etching processes due to the protection afforded by the metal layer.

According to some embodiments, the metal layer is patterned to generate a patterned metal layer. According to some embodiments, the patterned metal layer serves as a mask to pattern at least the first dielectric layer, such as by having a different etch selectivity to one or more etchants as compared to other layers, features, etc. According to some embodiments, the patterned metal layer protects at least portions of the first dielectric layer underlying the patterned metal layer during one or more etching processes. According to some embodiments, one or more characteristics, such as lattice structure, dielectric constant value, etc., of the portions of the first dielectric layer experience little to no change from the one or more etching processes due to the protection afforded by the patterned metal layer. According to some embodiments, sidewalls, corners, edges, etc. of the portions of first dielectric layer experience little to no rounding, non-linearity, etc. from the one or more etching processes due to the protection afforded by the patterned metal layer.

According to some embodiments, sidewalls, corners, edges, etc. of the first dielectric layer that define one or more openings, trenches, etc. in the first dielectric layer as a result of one or more etching processes performed with the patterned metal layer in place experience little to no rounding, non-linearity, etc. According to some embodiments, one or more openings, trenches, etc. defined in the first dielectric layer with the patterned metal layer in place are at least one of narrower or deeper than such openings, trenches, etc. formed without the patterned metal layer in place. According to some embodiments, one or more openings, trenches, etc. defined in the first dielectric layer with the patterned metal layer in place have a different, such as lower or higher, aspect ratio than such openings, trenches, etc. formed without the patterned metal layer in place. According to some embodiments, one or more features, structures, elements, etc. formed in the one or more openings, trenches, etc. have little to no rounding, non-linearity, etc. due to the 'true' nature of the sidewalls, corners, edges, etc. of the first dielectric layer that define the one or more openings, trenches, etc. According to some embodiments, one or more features, structures, elements, etc. formed in the one or more openings, trenches, etc. have a different, such as lower or higher, aspect ratio than such features, structures, elements, etc. formed in one or more openings, trenches, etc. that are formed without the patterned metal layer in place.

FIGS. 1A-11C illustrate a semiconductor arrangement 100 at various stages of fabrication, in accordance with some embodiments. FIGS. 1A, 2A, 3A, 4A, 5A, 6A, 7A, 8A, 9A, 10A, and 11A illustrate top views of the semiconductor arrangement 100 at various stages of fabrication, according to some embodiments. FIGS. 1B, 2B, 3B, 4B, 5B, 6B, 7B, 8B, 9B, 10B, and 11B illustrate cross views (B-B) of the semiconductor arrangement 100 of FIGS. 1A, 2A, 3A, 4A, 5A, 6A, 7A, 8A, 9A, 10A, and 11A, respectively, according to some embodiments. FIGS. 1C, 2C, 3C, 4C, 5C, 6C, 7C, 8C, 9C, 10C, and 11C illustrate cross views (C-C) of the semiconductor arrangement 100 of FIGS. 1A, 2A, 3A, 4A, 5A, 6A, 7A, 8A, 9A, 10A, and 11A, respectively, according to some embodiments. According to some embodiments, the views illustrated in FIGS. 1C, 2C, 3C, 4C, 5C, 6C, 7C, 8C, 9C, 10C, and 11C are 90-degrees relative to the views illustrated in FIGS. 1B, 2B, 3B, 4B, 5B, 6B, 7B, 8B, 9B, 10B, and 11B, respectively Referring to FIGS. 1A, 1B, and 1C, the semiconductor arrangement 100 includes an etch stop layer (ESL) 104, a first dielectric layer 106 over the ESL 104, and a metal layer 108 over the first dielectric layer 106, according to some embodiments. In some embodiments, the ESL 104 is formed over a substrate 102. In some embodiments, the substrate 102 includes at least one of an epitaxial layer, a silicon-on-insulator (SOI) structure, a wafer, or a die formed from a wafer. In some embodiments, the substrate 102 includes at least one of silicon or other suitable materials.

In some embodiments, the semiconductor arrangement 100 is patterned, such as etched. In some embodiments, the patterning of the semiconductor arrangement 100 is so performed that a plurality of vertical structures 110 is formed over the metal layer 108. In some embodiments, at least one of the vertical structures includes a hard mask (HM) 112 and a second dielectric layer 114. In some embodiments, the patterning stops at the metal layer 108 and the underlying layers, such as the first dielectric layer 106, the ESL 104 and the substrate 102, are not patterned. In some embodiments, the patterning process includes an etching process. In some embodiments, at least one of HF, a chlorine compound, or other suitable etchants are used to pattern the semiconductor arrangement 100. In some embodiments, a selectivity of the metal layer 108 to an etchant is different than a selectivity of the HM 112 and the second dielectric layer 114 to the etchant so that the HM 112 and the second dielectric layer 114 are etched but the metal layer 108 is not etched.

In some embodiments, the ESL 104 includes at least one of SiC, $SiO_2$, SiOC, SiCN, SiOCN, AlON, AlO, or other suitable materials. In some embodiments, the ESL 104 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, or other suitable techniques. In some embodiments, the ESL 104 is formed at a temperature of about 150 degrees Celsius to about 400 degrees Celsius. In some embodiments, the ESL 104 has a thickness of about 10 Angstroms to about 1000 Angstroms.

According to some embodiments, the first dielectric layer 106 includes a low-k dielectric material. In some embodiments, the first dielectric layer 106 has a dielectric constant of about 1.8 to about 5. In some embodiments, the first dielectric layer 106 includes at least one of SiC, $SiO_2$, SiOC, SiN, SiCN, SiON, SiOCN, or other suitable materials. In some embodiments, the first dielectric layer 106 is formed by at least one of PVD, sputtering, CVD, LPCVD, ALCVD, UHVCVD, RPCVD, ALD, MBE, LPE, spin on, or other suitable techniques. In some embodiments, the first dielectric layer 106 is formed at a temperature of about 50 degrees Celsius to about 400 degrees Celsius. In some embodiments, the first dielectric layer 106 has a thickness of about 30 Angstroms to about 800 Angstroms.

In some embodiment, the metal layer 108 includes a metal. In some embodiments, the metal layer 108 is not metal per se. According to some embodiments, the metal layer 108 includes a metallic compound. In some embodiments, the metal layer 108 includes at least one of Ta, TaN, TiN Cu, Co, Ru, Mo, Ir, W, or other suitable materials. According to some embodiments, the metal layer 108 acts as a barrier layer to protect the first dielectric layer 106 from degradation, patterning, etc. during one or more processing operations, such as etching, of the semiconductor arrangement 100. In some embodiments, the metal layer 108 is formed by at least one of PVD, sputtering, CVD, LPCVD, ALCVD, UHVCVD, RPCVD, ALD, MBE, LPE, spin on, or other suitable techniques. In some embodiments, the metal layer 108 is formed at a temperature of about 150 degrees Celsius to about 400 degrees Celsius. In some embodiments, the metal layer 108 has a thickness of about 10 Angstroms to about 1000 Angstroms.

In some embodiments, the HM 112 includes at least one of TiN, TiO, W, WC, HfO, ZrO, ZrTiO, or other suitable materials. In some embodiments, the HM 112 is formed by at least one of PVD, sputtering, CVD, LPCVD, ALCVD, UHVCVD, RPCVD, ALD, MBE, LPE, spin on, or other suitable techniques. In some embodiments, the HM 112 is formed at a temperature of about 50 degrees Celsius to about 400 degrees Celsius. In some embodiments, the HM 112 has a thickness of about 30 Angstroms to about 500 Angstroms.

In some embodiments, the second dielectric layer 114 includes at least one of SiC, $SiO_2$, SiOC, SiN, SiCN, SiON, SiOCN, or other suitable materials. In some embodiments, the second dielectric layer 114 is formed by at least one of PVD, sputtering, CVD, LPCVD, ALCVD, UHVCVD, RPCVD, ALD, MBE, LPE, spin on, or other suitable techniques. In some embodiments, the second dielectric layer 114 is formed at a temperature of about 50 degrees Celsius to about 400 degrees Celsius. In some embodiments, the second dielectric layer 114 has a thickness of about 30 Angstroms to about 800 Angstroms.

In some embodiments, the first dielectric layer 106 and the second dielectric layer 114 are formed in a same manner. In some embodiments, the first dielectric layer 106 and the second dielectric layer 114 are formed in different manners. In some embodiments, the first dielectric layer 106 and the second dielectric layer 114 have a same material composition. In some embodiments, the first dielectric layer 106 and the second dielectric layer 114 do not have a same material composition.

Figure 2A:
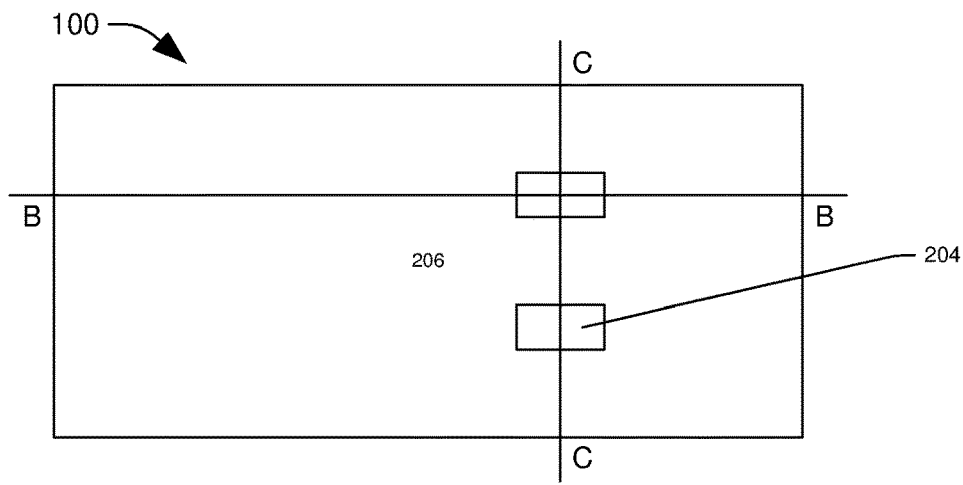
FIGS. 2A-2C illustrate a semiconductor arrangement at a stage of fabrication, in accordance with some embodiments.
Figure 2B:
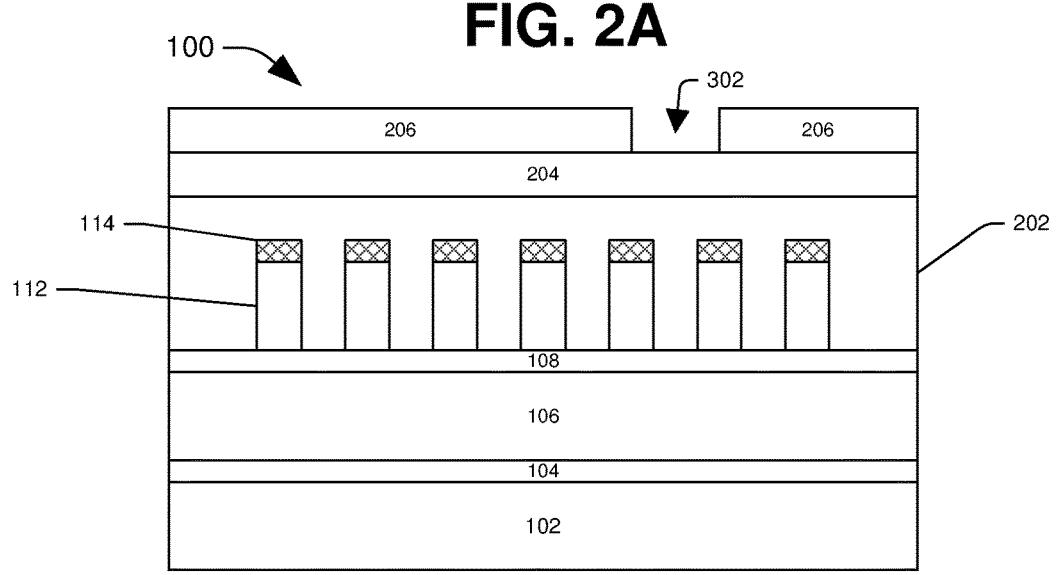
Figure 2C:
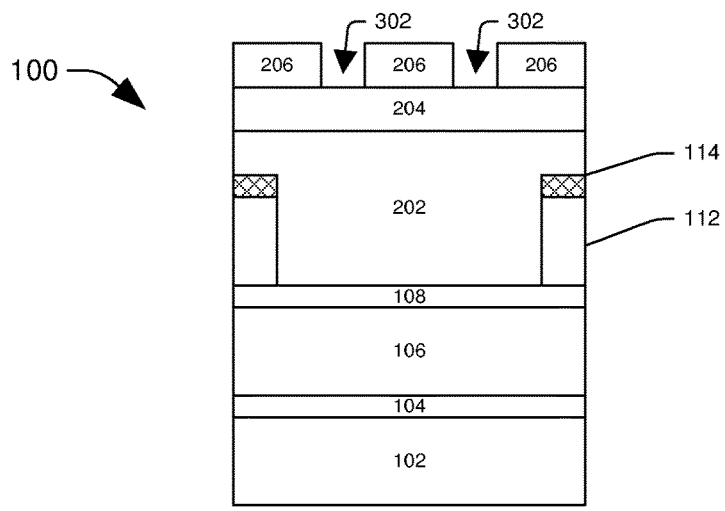

Referring to FIGS. 2A, 2B, and 2C, a barrier layer (BL) 202 is formed over the metal layer 108, the HM 112, and the second dielectric layer 114, including sidewalls of the HM 112 and sidewalls of the second dielectric layer 114, according to some embodiments. In some embodiments, the BL 202 includes at least one of oxide, nitride, or other suitable materials. In some embodiments, the BL 202 is formed by at least one of PVD, sputtering, CVD, LPCVD, ALCVD, UHVCVD, RPCVD, ALD, MBE, LPE, spin on, or other suitable techniques. In some embodiments, the second dielectric layer 114 has a thickness of about 300 Angstroms to about 2000 Angstroms.

In some embodiments, a protective metal layer (ML) 204 is formed over the BL 202. In some embodiment, the ML 204 includes a metal. In some embodiments, the ML 204 is not metal per se. According to some embodiments, the ML 204 includes a metallic compound. According to some embodiments, the ML 204 includes metal nitride or other suitable materials. In some embodiments, the ML 204 is formed by at least one of PVD, sputtering, CVD, LPCVD, ALCVD, UHVCVD, RPCVD, ALD, MBE, LPE, spin on, or other suitable techniques. In some embodiments, the ML 204 is formed at a temperature of about 150 degrees Celsius to about 400 degrees Celsius. In some embodiments, the metal layer 108 has a thickness of about 10 Angstroms to about 1000 Angstroms.

In some embodiments, a photoresist layer (PR) 206 is formed over the ML 204. In some embodiments, the PR 206 includes a light sensitive material where properties, such as solubility, of the PR 206 are affected by light. The PR 206 is either a negative photoresist or a positive photoresist. With respect to the negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In the positive photoresist, illuminated regions of the positive photoresist become soluble and are removed via application of the solvent during development. Thus, a pattern formed in the positive photoresist is a positive image of opaque regions of the template between the light source and the positive photoresist. According to some embodiments, an etchant has a selectivity such that the etchant removes or etches away the layer under the photoresist at a greater rate than the etchant removes or etches away the photoresist. Accordingly, an opening in the photoresist allows the etchant to form a corresponding opening in the layer under the photoresist, and thereby transfer a pattern in the photoresist to the layer under the photoresist. The pattern in the layer under the photoresist is filled with one or more materials to form one or more elements, features, etc. and the patterned photoresist is stripped or washed away at least one of before or after the pattern in the layer under the photoresist is filled with the one or more materials. In some embodiments, the PR 206 is formed by at least one of PVD, sputtering, CVD, LPCVD, ALCVD, UHVCVD, RPCVD, ALD, MBE, LPE, spin on, or other suitable techniques. In some embodiments, the PR 206 has a thickness of about 10 Angstroms to about 1000 Angstroms. In some embodiments, one or more openings 302 are formed in the PR 206. In some embodiments, the openings 302 expose a top surface of the ML 204.

Figure 3A:
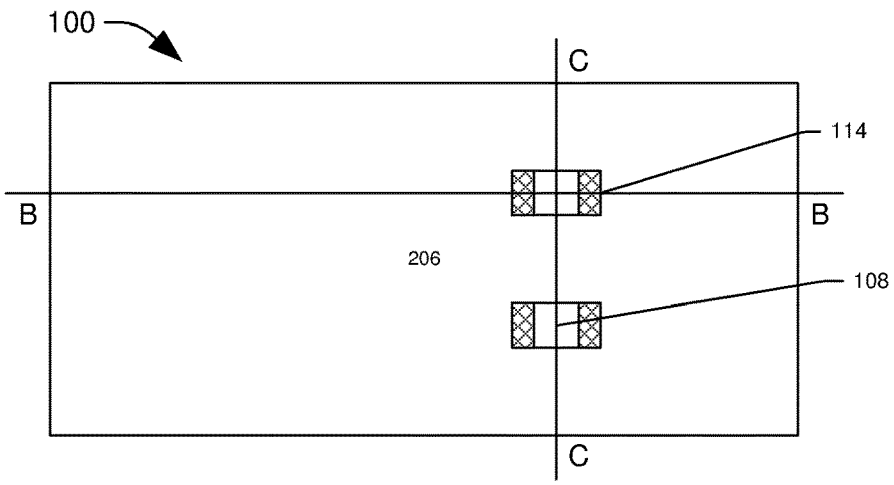
FIGS. 3A-3C illustrate a semiconductor arrangement at a stage of fabrication, in accordance with some embodiments.
Figure 3B:
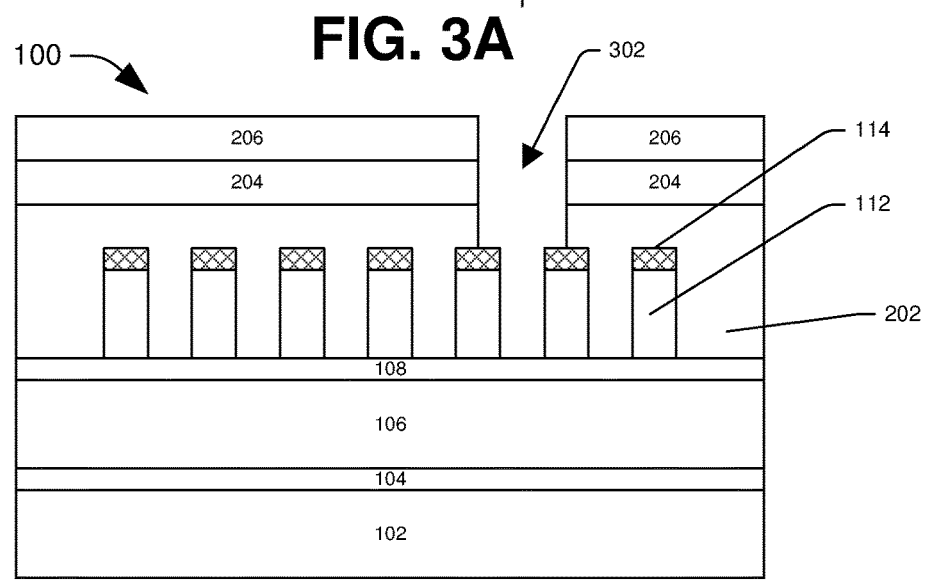
Figure 3C:
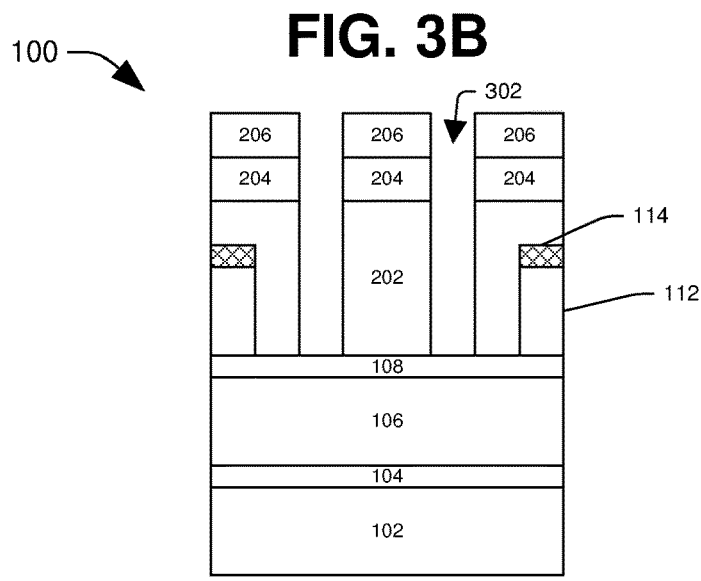

Referring to FIGS. 3A, 3B, and 3C, in some embodiments, the openings 302 are deepened by removing some of the ML 204 and BL 202. In some embodiments, the removal process is so performed that a top surface of the metal layer 108 is exposed. In some embodiments, removal of at least one of the ML 204 or the BL 202 includes at least one of etching or wet clean. According to some embodiments, an etchant is used that removes or etches away at least one of the ML 204 or the BL 202 at a greater rate than the etchant removes or etches away at least one of the PR 206 or the metal layer 108. In some embodiments, removal of at least one of the ML 204 or the BL 202 includes at least one of inductively coupled plasma (ICP), capacitively coupled plasma (CCP), ion beam etching (IBE), a remote plasma method, or other suitable techniques. In some embodiments, removal of at least one of the ML 204 or the BL 202 uses at least one of $CH_4$, $CH_3F$, $CH_2F_2$, $CH F_3$, $C_4F_8$, $C_4F_6$, $CF_4$, $H_2$, HBr, CO, $CO_2$, $O_2$, $BCl_3$, $Cl_2$, He, $N_2$, Ne, Ar, $CH_3OH$, $C_2H_5OH$, or other suitable material as a source of plasma. According to some embodiments, removal of at least one of the ML 204 or the BL 202 is performed at a pressure of about 0.2 mT to about 120 mT. According to some embodiments, removal of at least one of the ML 204 or the BL 202 is performed at a temperature of about 0° C. to about 100° C. According to some embodiments, removal of at least one of the ML 204 or the BL 202 is performed using a power of about 50 W to about 3000 W. According to some embodiments, removal of at least one of the ML 204 or the BL 202 is performed using a bias of about 0V to about 1200V.

Figure 4A:
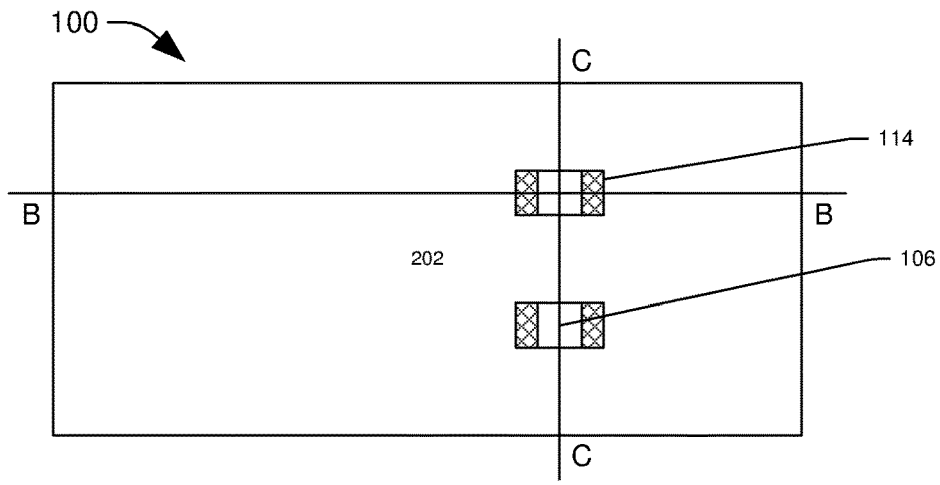
FIGS. 4A-4C illustrate a semiconductor arrangement at a stage of fabrication, in accordance with some embodiments.
Figure 4B:
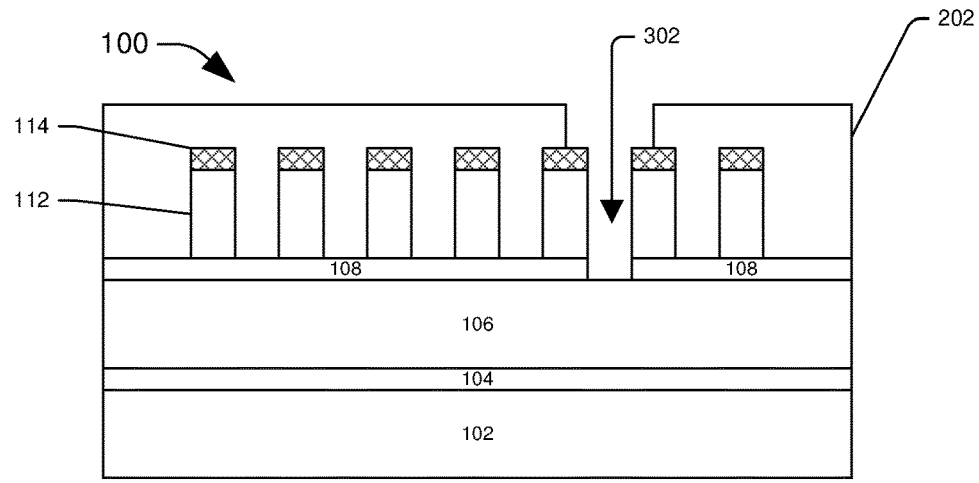
Figure 4C:
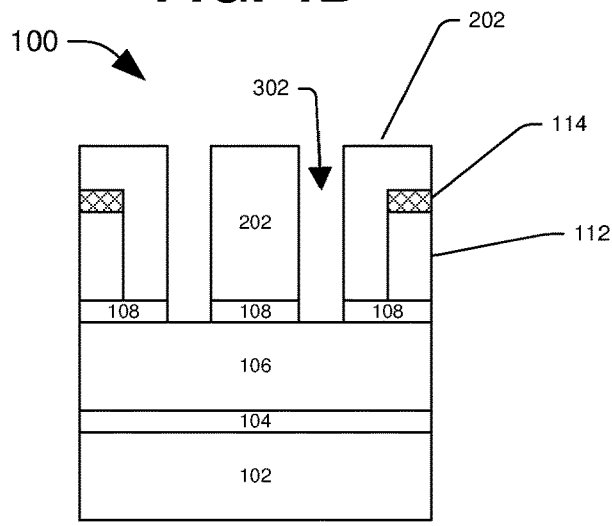

Referring to FIGS. 4A, 4B, and 4C, in some embodiments, the openings 302 are deepened by patterning or removing some of the metal layer 108, thereby generating a patterned metal layer. In some embodiments, the removal process is so performed that a top surface of the first dielectric layer 106 is exposed. In some embodiments, removal of the metal layer 108 includes at least one of etching or wet clean. According to some embodiments, an etchant is used that removes or etches away the metal layer 108 at a greater rate than the etchant removes or etches away at least one of the BL 202 or the first dielectric layer 106. In some embodiments, removal of the metal layer 108 includes at least one of ICP, CCP, IBE, a remote plasma method, or other suitable techniques. In some embodiments, removal of the metal layer 108 uses at least one of $CH_4$, $CH_3F$, $CH_2F_2$, $CH F_3$, $C_4F_8$, $C_4F_6$, $CF_4$, $H_2$, HBr, CO, $CO_2$, $O_2$, $BCl_3$, $Cl_2$, He, $N_2$, Ne, Ar, $CH_3OH$, $C_2H_5OH$, or other suitable material as a source of plasma. According to some embodiments, removal of the metal layer 108 is performed at a pressure of about 0.2 mT to about 120 mT. According to some embodiments, removal of the metal layer 108 is performed at a temperature of about 0° C. to about 100° C. According to some embodiments, removal of the metal layer 108 is performed using a power of about 50 W to about 3000 W. According to some embodiments, removal of the metal layer 108 is performed using a bias of about 0V to about 1200V.

In some embodiments, remaining portions of the PR 206 and ML 204 are removed. In some embodiments, remaining portions of at least one of the PR 206 or the ML 204 are removed as some of the metal layer 108 is removed to deepen the openings 302. In some embodiments, remaining portions of at least one of the PR 206 or the ML 204 are removed by a different process than the process that removes some of the metal layer 108 to deepen the openings 302. In some embodiments, remaining portions of at least one of the PR 206 or the ML 204 are removed by at least one of stripping, wet clean, chemical mechanical polishing (CMP), or other suitable techniques, alone or in combination with the process that removes some of the metal layer 108 to deepen the openings 302.

Figure 5A:
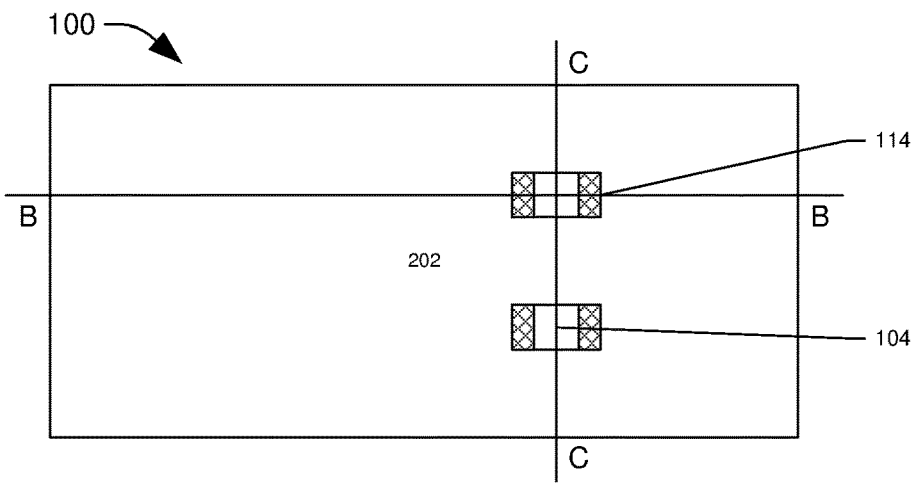
FIGS. 5A-5C illustrate a semiconductor arrangement at a stage of fabrication, in accordance with some embodiments.
Figure 5B:
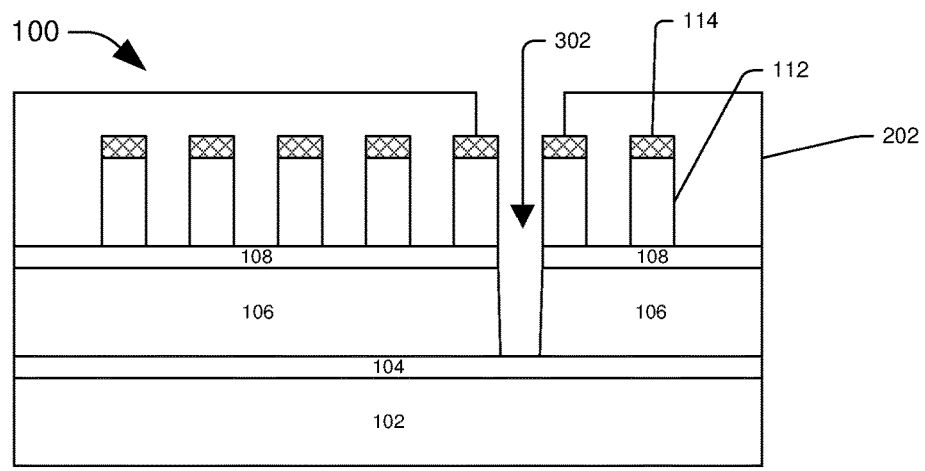
Figure 5C:
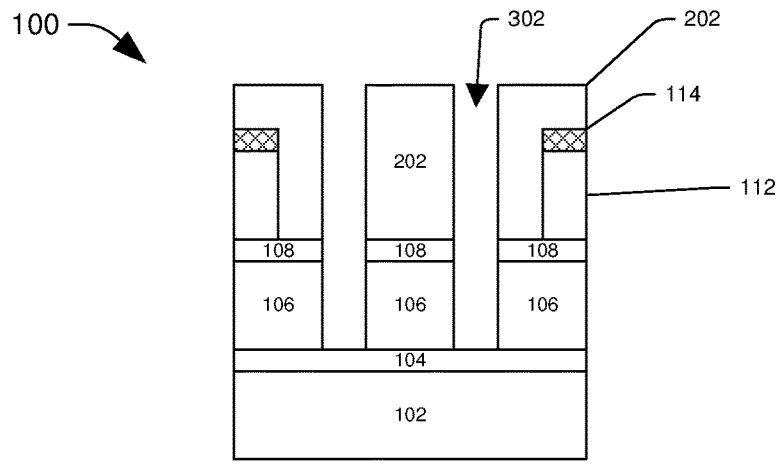

Referring to FIGS. 5A, 5B, and 5C, in some embodiments, the openings 302 are deepened by patterning or removing some of the first dielectric layer 106, thereby generating a patterned first dielectric layer. In some embodiments, the removal process is so performed that a top surface of the ESL 104 is exposed. In some embodiments, removal of the first dielectric layer 106 includes at least one of etching or wet clean. According to some embodiments, an etchant is used that removes or etches away the first dielectric layer 106 at a greater rate than the etchant removes or etches away at least one of the BL 202 or the ESL 104. In some embodiments, removal of the first dielectric layer 106 includes at least one of ICP, CCP, IBE, a remote plasma method, or other suitable techniques. In some embodiments, removal of the first dielectric layer 106 uses at least one of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, He, $N_2$, Ne, Ar, $CH_3OH$, $C_2H_5OH$, or other suitable material as a source of plasma. According to some embodiments, removal of the first dielectric layer 106 is performed at a pressure of about 0.2 mT to about 120 mT. According to some embodiments, removal of the first dielectric layer 106 is performed at a temperature of about 0° C. to about 100° C. According to some embodiments, removal of the first dielectric layer 106 is performed using a power of about 50 W to about 3000 W. According to some embodiments, removal of the first dielectric layer 106 is performed using a bias of about 0V to about 1200V.

According to some embodiments, at least two of removal of some of the ML 204, removal of some of the BL 202, removal of some of the metal layer 108, or removal of some of the first dielectric layer 106 to deepen the openings 302 are accomplished by a single, same, continuous, etc. process, such as an etching process. According to some embodiments, at least two of removal of some of the ML 204, removal of some of the BL 202, removal of some of the metal layer 108, or removal of some of the first dielectric layer 106 to deepen the openings 302 are not accomplished by a single, same, continuous, etc. process, such as an etching process.

Figure 6A:
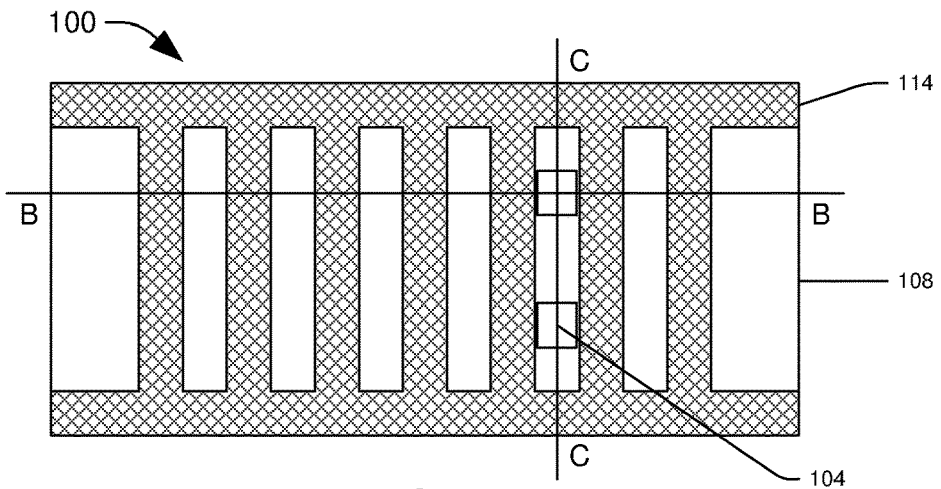
FIGS. 6A-6C illustrate a semiconductor arrangement at a stage of fabrication, in accordance with some embodiments.
Figure 6B:
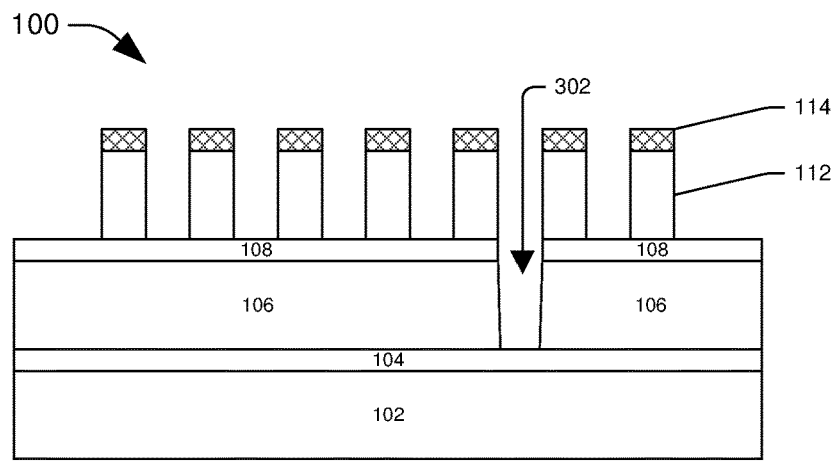
Figure 6C:
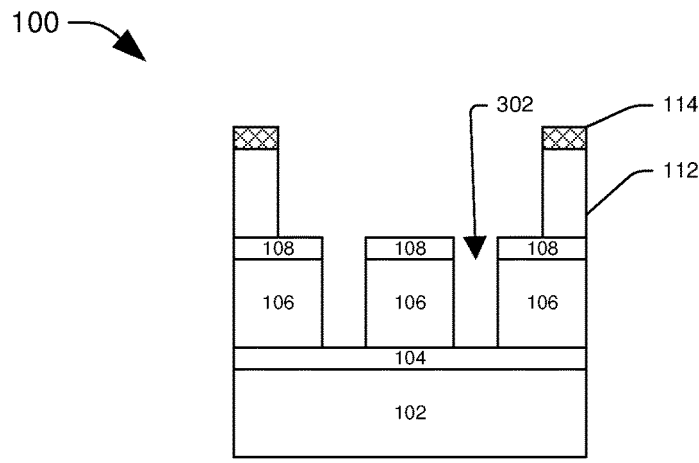

Referring to FIGS. 6A, 6B, and 6C, in some embodiments, the BL 202 is removed. In some embodiments, removal of the BL 202 includes at least one of etching or wet clean. According to some embodiments, an etchant is used that removes or etches away the BL 202 at a greater rate than the etchant removes or etches away at least one of the second dielectric layer 114, the HM 112, the metal layer 108, the first dielectric layer 106, or the ESL 104. In some embodiments, removal of the first dielectric layer 106 includes at least one of ICP, CCP, IBE, a remote plasma method, or other suitable techniques. In some embodiments, removal of the BL 202 uses at least one of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, He, $N_2$, Ne, Ar, $CH_3OH$, $C_2H_5OH$, or other suitable material as a source of plasma. According to some embodiments, removal of the BL 202 is performed at a pressure of about 0.2 mT to about 120 mT. According to some embodiments, removal of the BL 202 is performed at a temperature of about 0° C. to about 100° C. According to some embodiments, removal of the BL 202 is performed using a power of about 50 W to about 3000 W. According to some embodiments, removal of the BL 202 is performed using a bias of about 0V to about 1200V. According to some embodiments, removal of the BL 202 occurs during at least one of removal of some of the ML 204, removal of some of the BL 202, removal of some of the metal layer 108, or removal of some of the first dielectric layer 106 to deepen the openings 302.

Figure 7A:
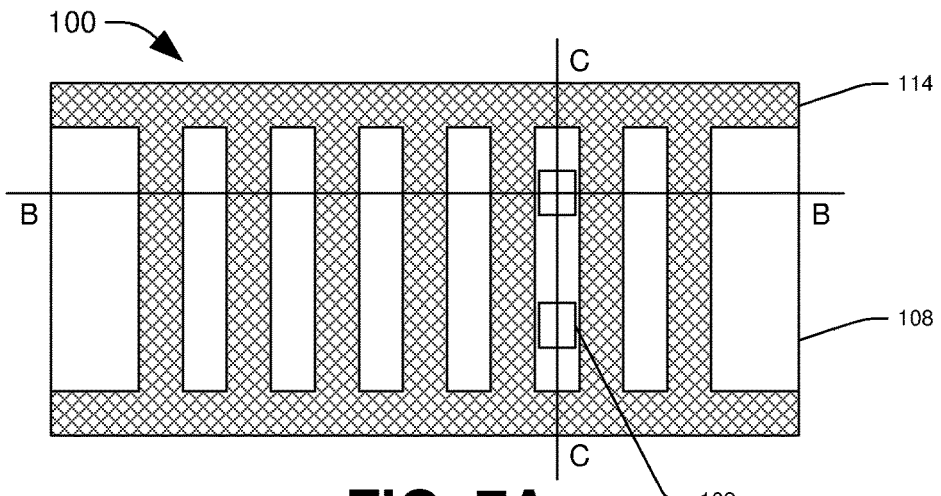
FIGS. 7A-7C illustrate a semiconductor arrangement at a stage of fabrication, in accordance with some embodiments.
Figure 7B:
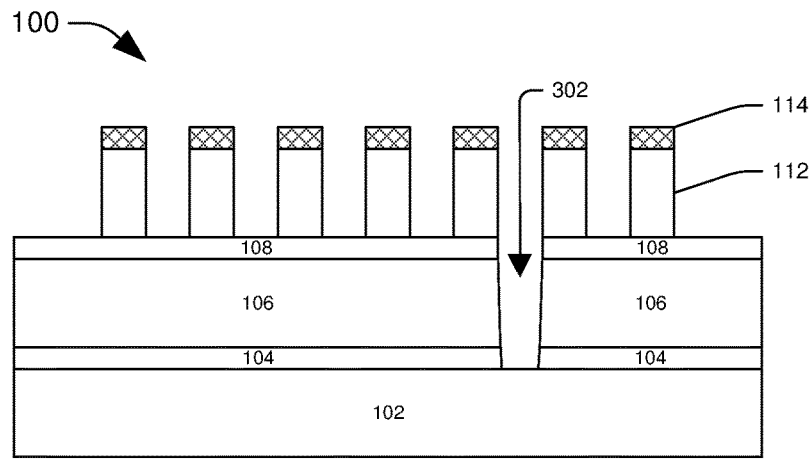
Figure 7C:
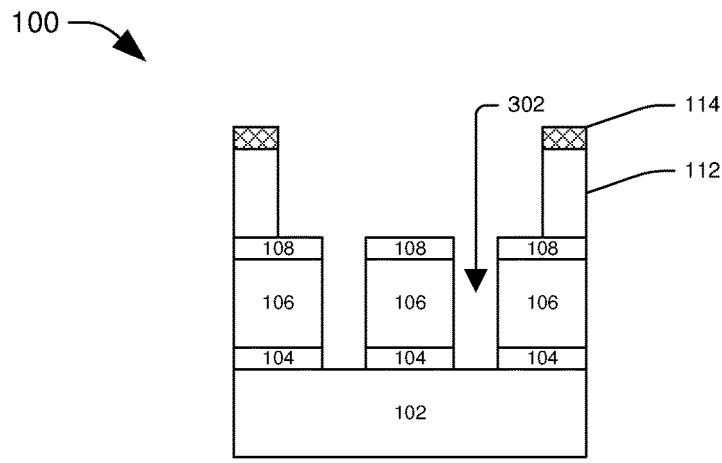

Referring to FIGS. 7A, 7B, and 7C, in some embodiments, the openings 302 are deepened by patterning or removing some of the ESL 104, thereby generating a patterned ESL. In some embodiments, the removal process is so performed that a top surface of the substrate 102 is exposed. In some embodiments, removal of the ESL 104 includes at least one of etching or wet clean. According to some embodiments, an etchant is used that removes or etches away the ESL 104 at a greater rate than the etchant removes or etches away at least one of the second dielectric layer 114, the HM 112, the metal layer 108, the first dielectric layer 106, or the substrate 102. In some embodiments, removal of the ESL 104 includes at least one of ICP, CCP, IBE, a remote plasma method, or other suitable techniques. In some embodiments, removal of the ESL 104 uses at least one of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, He, $N_2$, Ne, Ar, $CH_3OH$, $C_2H_5OH$, or other suitable material as a source of plasma. According to some embodiments, removal of the ESL 104 is performed at a pressure of about 0.2 mT to about 120 mT. According to some embodiments, removal of the ESL 104 is performed at a temperature of about 0° C. to about 100° C. According to some embodiments, removal of the ESL 104 is performed using a power of about 50 W to about 3000 W. According to some embodiments, removal of the ESL 104 is performed using a bias of about 0V to about 1200V.

Figure 8A:
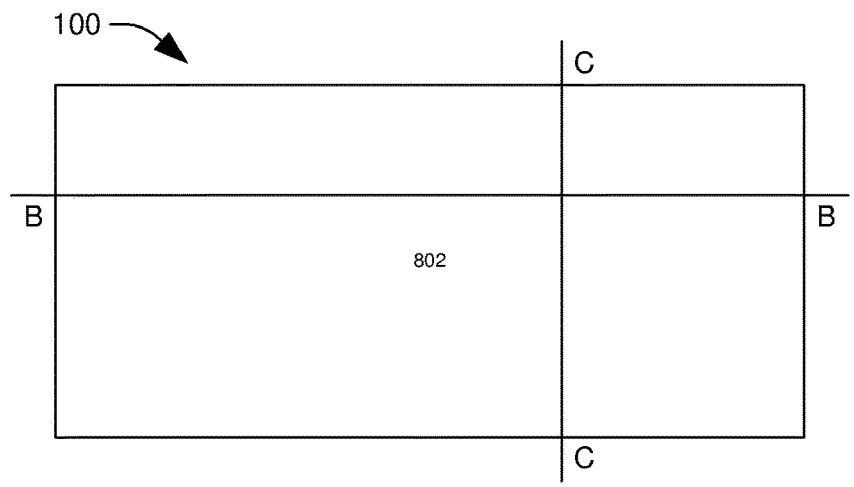
FIGS. 8A-8C illustrate a semiconductor arrangement at a stage of fabrication, in accordance with some embodiments.
Figure 8B:
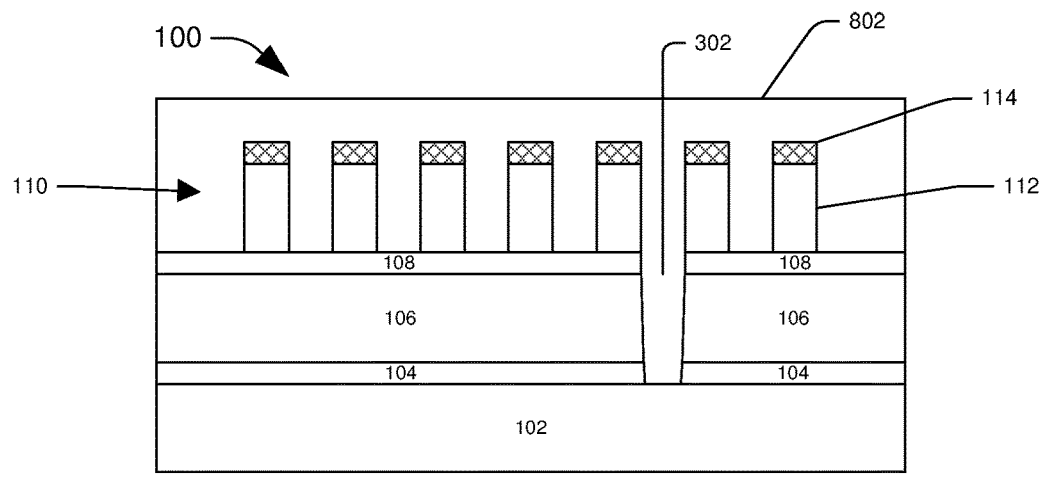
Figure 8C:
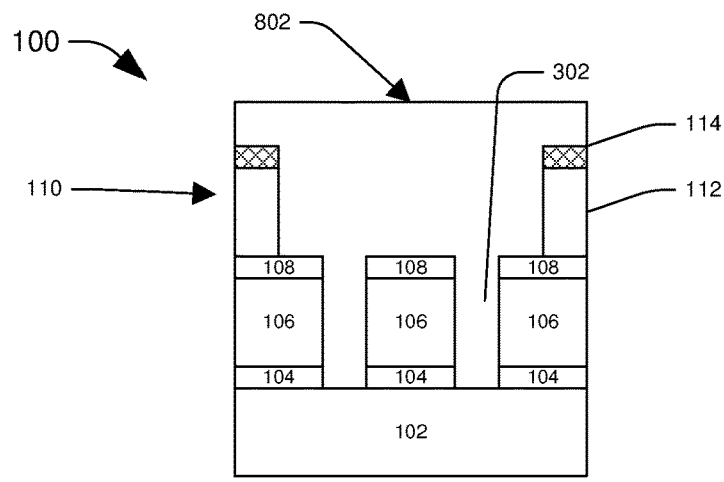

Referring to FIGS. 8A, 8B, and 8C, in some embodiments, a conductive layer 802 is formed. According to some embodiments, the conductive layer 802 fills the openings 302. In some embodiments, a height of the conductive layer 802 is greater than a height of the plurality of vertical structures 110. In some embodiment, the conductive layer 802 includes a metal. In some embodiments, the conductive layer 802 is not metal per se. According to some embodiments, the conductive layer 802 includes a metallic compound. In some embodiments, the conductive layer 802 includes at least one of Ta, TaN, TiN Cu, Co, Ru, Mo, Ir, W, or other suitable materials. According to some embodiments, the conductive layer 802 has a same material composition as the metal layer 108. According to some embodiments, the conductive layer 802 does not have a same material composition as the metal layer 108. Given that the conductive layer 802 is formed after the metal layer 108, an interface exists between the conductive layer 802 and the metal layer 108. In some embodiments, the conductive layer 802 is formed by at least one of PVD, sputtering, CVD, LPCVD, ALCVD, UHVCVD, RPCVD, ALD, MBE, LPE, spin on, or other suitable techniques.

Figure 9A:
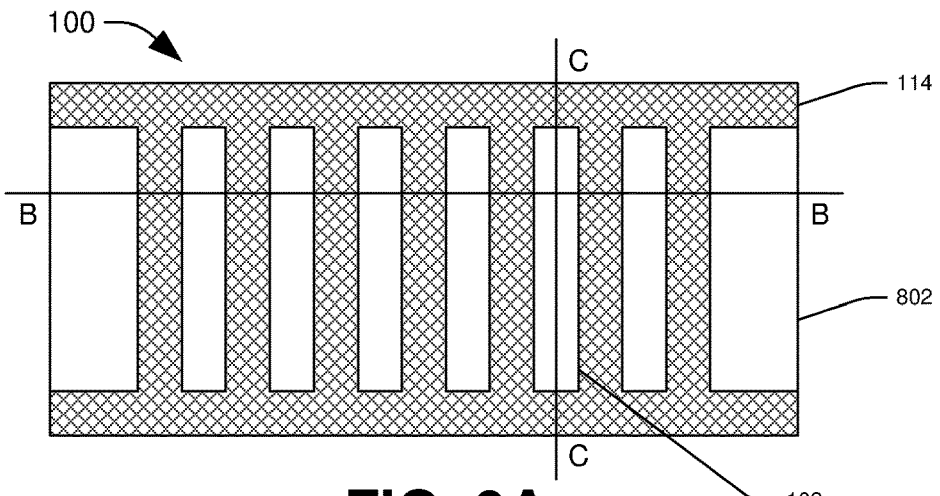
FIGS. 9A-9C illustrate a semiconductor arrangement at a stage of fabrication, in accordance with some embodiments.
Figure 9B:
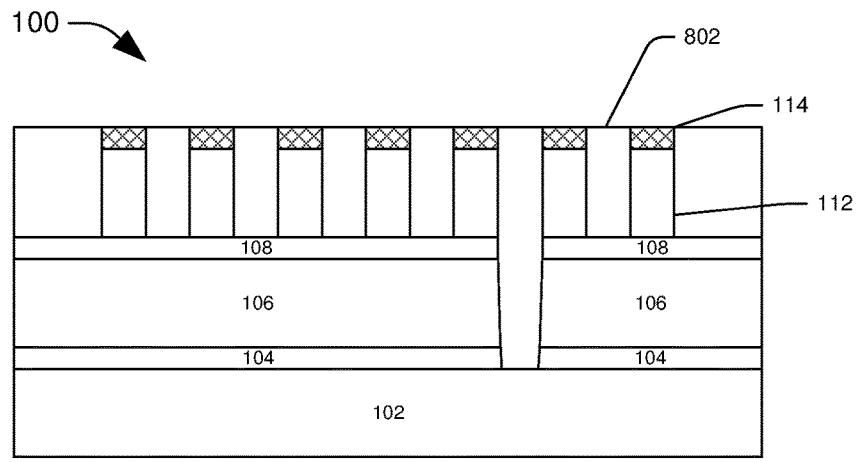
Figure 9C:
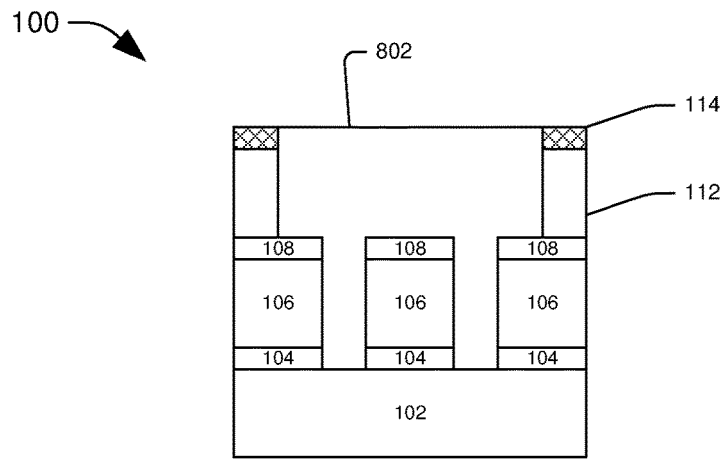

Referring to FIGS. 9A, 9B, and 9C, in some embodiments, excess conductive layer 802 is removed. According to some embodiments, the top surfaces of the plurality of vertical structures 110 are exposed after removal of the excess conductive layer 802. In some embodiments, the excess conductive layer 802 is removed by at least one of CMP or other suitable techniques.

Figure 10A:
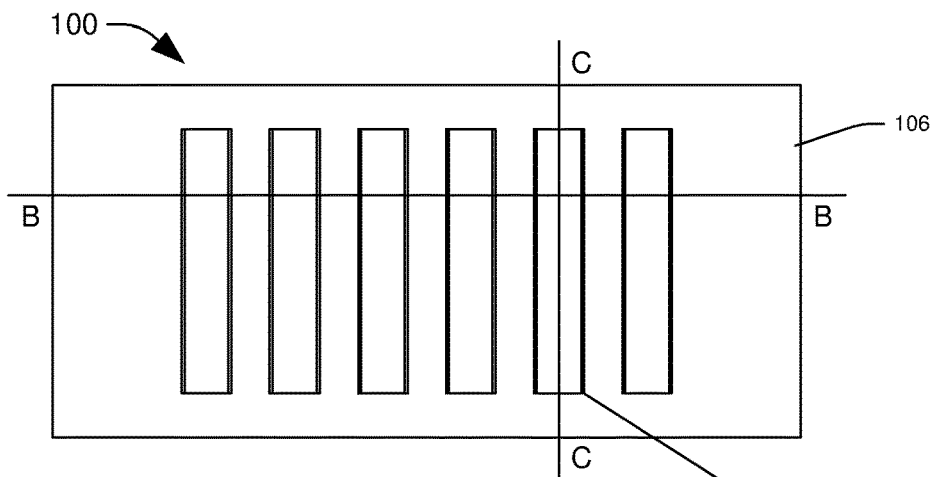
FIGS. 10A-10C illustrate a semiconductor arrangement at a stage of fabrication, in accordance with some embodiments.
Figure 10B:
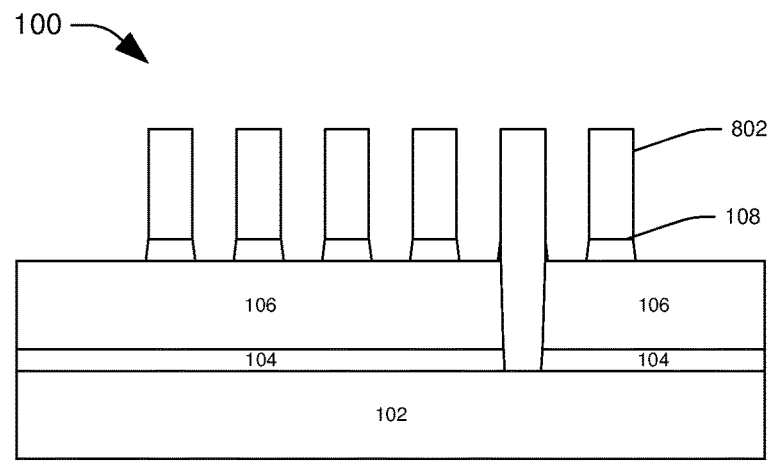
Figure 10C:
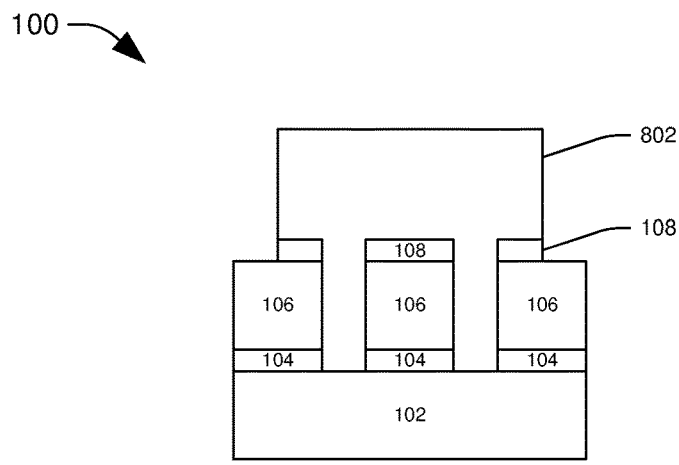

Referring to FIGS. 10A, 10B, and 10C, in some embodiments, the vertical structures 110, comprising the second dielectric layer 114 and the HM 112, and portions of the metal layer 108 underlying the vertical structures 110 are removed. In some embodiments, the removal process is so performed that a top surface of the first dielectric layer 106 is exposed. In some embodiments, removal of at least one of the vertical structures 110 or the portions of the metal layer 108 underlying the vertical structures 110 includes at least one of etching or wet clean. According to some embodiments, an etchant is used that removes or etches away at least one of the vertical structures 110 or the portions of the metal layer 108 underlying the vertical structures 110 at a greater rate than the etchant removes or etches away at least one of the first dielectric layer 106 or the conductive layer 802. In some embodiments, removal of at least one of the vertical structures 110 or the portions of the metal layer 108 underlying the vertical structures 110 includes at least one of ICP, CCP, IBE, a remote plasma method, or other suitable techniques. In some embodiments, removal of at least one of the vertical structures 110 or the portions of the metal layer 108 underlying the vertical structures 110 uses at least one of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, He, $N_2$, Ne, Ar, $CH_3OH$, $C_2H_5OH$, or other suitable material as a source of plasma. According to some embodiments, removal of at least one of the vertical structures 110 or the portions of the metal layer 108 underlying the vertical structures 110 is performed at a pressure of about 0.2 mT to about 120 mT. According to some embodiments, removal of at least one of the vertical structures 110 or the portions of the metal layer 108 underlying the vertical structures 110 is performed at a temperature of about 0° C. to about 100° C. According to some embodiments, removal of at least one of the vertical structures 110 or the portions of the metal layer 108 underlying the vertical structures 110 is performed using a power of about 50 W to about 3000 W. According to some embodiments, removal of at least one of the vertical structures 110 or the portions of the metal layer 108 underlying the vertical structures 110 is performed using a bias of about 0V to about 1200V. According to some embodiments, a mask is formed over the conductive layer 802 to protect the conductive layer 802 and structures, features, elements, etc. underlying the conductive layer 802 when the vertical structures 110 and the portions of the metal layer 108 underlying the vertical structures 110 are removed.

Figure 11A:
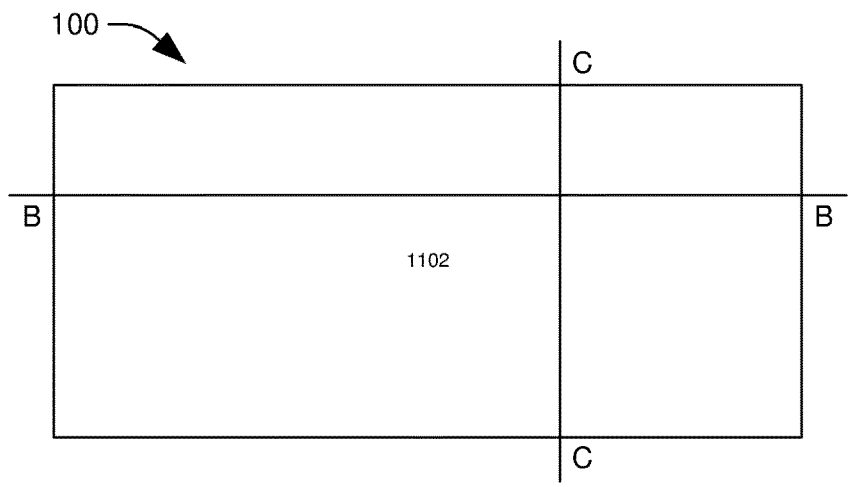
FIGS. 11A-11C illustrate a semiconductor arrangement at a stage of fabrication, in accordance with some embodiments.
Figure 11B:
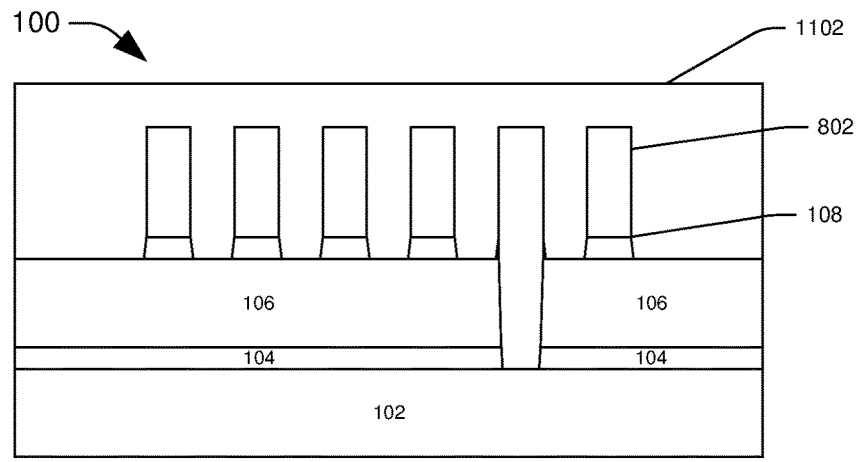
Figure 11C:
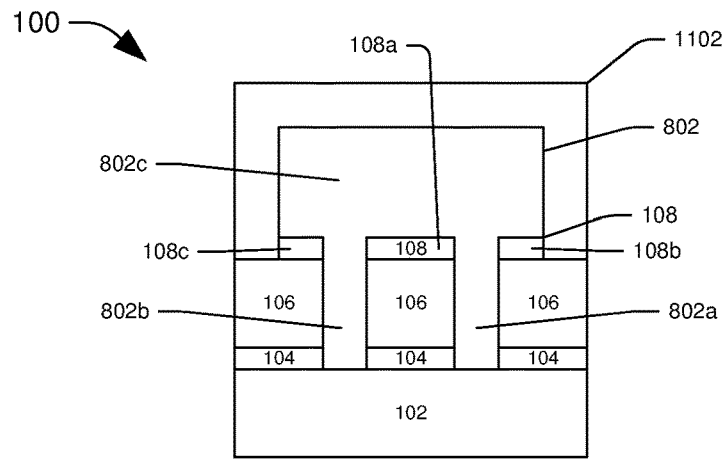

Referring to FIGS. 11A, 11B, and 11C, a third dielectric layer 1102 is formed over first dielectric layer 106, the conductive layer 802, and the metal layer 108, including sidewalls of the conductive layer 802 and the metal layer 108, according to some embodiments. In some embodiments, a height of the third dielectric layer 1102 is greater than a height of the conductive layer 802. According to some embodiments, the third dielectric layer 1102 includes a low-k dielectric material. In some embodiments, the third dielectric layer 1102 has a dielectric constant of about 1.8 to about 5. In some embodiments, the third dielectric layer 1102 includes at least one of SiC, $SiO_2$, SiOC, SiN, SiCN, SiON, SiOCN, or other suitable materials. In some embodiments, the third dielectric layer 1102 is formed by at least one of PVD, sputtering, CVD, LPCVD, ALCVD, UHVCVD, RPCVD, ALD, MBE, LPE, spin on, or other suitable techniques. In some embodiments, the third dielectric layer 1102 is formed at a temperature of about 50 degrees Celsius to about 400 degrees Celsius. In some embodiments, the first dielectric layer 106 has a thickness of about 1000 Angstroms to about 3000 Angstroms.

In some embodiments, the third dielectric layer 1102 is formed in a same manner as at least one of the first dielectric layer 106 or the second dielectric layer 114. In some embodiments, the third dielectric layer 1102 is not formed in a same manner as at least one of the first dielectric layer 106 or the second dielectric layer 114. In some embodiments, the third dielectric layer 1102 has a same material composition as at least one of the first dielectric layer 106 or the second dielectric layer 114. In some embodiments, the third dielectric layer 1102 does not have a same material composition as at least one of the first dielectric layer 106 or the second dielectric layer 114.

According to some embodiments, at least one of the one or more layers, features, structures, elements, etc. disclosed herein are in direct contact with another of the one or more layers, features, structures, elements, etc. disclosed herein. According to some embodiments, at least one of the one or more layers, features, structures, elements, etc. disclosed herein are not in direct contact with another of the one or more layers, features, structures, elements, etc. disclosed herein, such as where one or more intervening, separating, etc. layers, features, structures, elements, etc. exist.

According to some embodiments, a first portion 802a of the conductive layer 802 constitutes a first conductive structure passing through the metal layer 108, the first dielectric layer 106, and the ESL 104. According to some embodiments, a second portion 802b of the conductive layer 802 constitutes a second conductive structure passing through the metal layer 108, the first dielectric layer 106, and the ESL 104. Given that the conductive layer 802 is formed after the metal layer 108, an interface exists between the metal layer 108 and at least one of the first conductive structure or the second conductive structure. According to some embodiments, a third portion 802c of the conductive layer 802 constitutes a third conductive structure that couples the first conductive structure to the second conductive structure. According to some embodiments, the third conductive structure overlies a first portion 108a of the metal layer 108 between the first conductive structure and the second conductive structure. According to some embodiments, the third conductive structure overlies a second portion 108b of the metal layer 108 adjacent the first conductive structure but not between the first conductive structure and the second conductive structure. According to some embodiments, the third conductive structure overlies a third portion 108c of the metal layer 108 adjacent the second conductive structure but not between the first conductive structure and the second conductive structure. According to some embodiments at least one of the first conductive structure or the second conductive structure has a height of about 5 nm to about 3000 nm. According to some embodiments at least one of the first conductive structure or the second conductive structure has a width of about 50 nm to about 300 nm.

According to some embodiments, at least due to the protection afforded by the metal layer 108, one or more characteristics, such as lattice structure, dielectric constant value, etc., of the first dielectric layer 106 experience little to no change from one or more fabrication processes, such as etching. According to some embodiments, at least due to the protection afforded by the metal layer 108, sidewalls, corners, edges, etc. of the first dielectric layer experience little to no rounding, non-linearity, etc. from one or more fabrication processes, such as etching.

According to some embodiments, at least due to the protection afforded by the metal layer 108, one or more features, structures, elements, etc., such as at least one of the first conductive structure or the second conductive structure, formed in one or more openings, trenches, etc. in the first dielectric layer 106 have little to no rounding, non-linearity, etc. due to the 'true' nature of the sidewalls, corners, edges, etc. of the first dielectric layer 106 that define the one or more openings, trenches, etc.

According to some embodiments, a method for forming a semiconductor arrangement includes forming a metal layer over a first dielectric layer, patterning the metal layer to generate a patterned metal layer, patterning the first dielectric layer using the patterned metal layer to generate a patterned first dielectric layer, wherein a first opening is defined in the patterned metal layer and the patterned first dielectric layer, forming a first conductive structure in the first opening, and forming a second dielectric layer over the first conductive structure, the patterned metal layer, and the patterned first dielectric layer, wherein a sidewall of a portion of the second dielectric layer overlying a first portion of the patterned first dielectric layer is adjacent a sidewall of a first portion of the patterned metal layer overlying a second portion of the patterned first dielectric layer.

According to some embodiments, a semiconductor arrangement includes a first dielectric layer over a substrate, a metal layer over the first dielectric layer, a first conductive structure passing through the metal layer and the first dielectric layer, a second conductive structure passing through the metal layer and the first dielectric layer, and a third conductive structure coupling the first conductive structure to the second conductive structure, and overlying a first portion of the metal layer between the first conductive structure and the second conductive structure, wherein an interface exists between the metal layer and at least one of the first conductive structure or the second conductive structure.

According to some embodiments, a method for forming a semiconductor arrangement includes forming a metal layer over an etch stop layer (ESL), patterning the metal layer to generate a patterned metal layer, and patterning the ESL using the patterned metal layer to generate a patterned ESL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor arrangement, comprising:
   forming a metal layer over a first dielectric layer;
   patterning the metal layer to generate a patterned metal layer;
   patterning the first dielectric layer using the patterned metal layer to generate a patterned first dielectric layer, wherein a first opening is defined in the patterned metal layer and the patterned first dielectric layer;

forming a first conductive structure in the first opening; and forming a second dielectric layer over the first conductive structure, the patterned metal layer, and the patterned first dielectric layer, wherein a sidewall of a portion of the second dielectric layer overlying a first portion of the patterned first dielectric layer is adjacent a sidewall of a first portion of the patterned metal layer overlying a second portion of the patterned first dielectric layer.

2. The method of claim 1, wherein a second opening is defined in the patterned metal layer and the patterned first dielectric layer, and the method comprises:

forming a second conductive structure in the second opening.

3. The method of claim 2, comprising:

forming a third conductive structure coupling the first conductive structure to the second conductive structure.

4. The method of claim 3, wherein a second portion of the patterned metal layer is between the first conductive structure and the second conductive structure, and the third conductive structure overlies the second portion of the patterned metal layer.

5. The method of claim 1, comprising:

forming the first dielectric layer over an etch stop layer (ESL); and patterning the ESL using at least one of the patterned metal layer or the patterned first dielectric layer to generate a patterned ESL.

6. The method of claim 3, wherein the sidewall of the portion of the second dielectric layer is adjacent a sidewall of the third conductive structure.

7. The method of claim 5, wherein the first opening is defined in the patterned ESL.

8. The method of claim 3, wherein the third conductive structure overlies the first portion of the patterned metal layer.

9. The method of claim 8, wherein patterning the metal layer and patterning the first dielectric layer comprises:

performing a continuous etching process to generate the patterned metal layer and the patterned first dielectric layer.

10. The method of claim 1, wherein the first dielectric layer comprises a low-k dielectric material.

11. The method of claim 1, wherein an interface exists between the first conductive structure and the first portion of the patterned metal layer.

12. The method of claim 3, wherein the second dielectric layer overlies a second portion of the patterned metal layer and the third conductive structure.

13. A semiconductor arrangement, comprising:

a first dielectric layer over a substrate;

a metal layer over the first dielectric layer;

a first conductive structure passing through the metal layer and the first dielectric layer;

a second conductive structure passing through the metal layer and the first dielectric layer; and a third conductive structure coupling the first conductive structure to the second conductive structure and overlying a first portion of the metal layer between the first conductive structure and the second conductive structure, wherein an interface exists between the metal layer and at least one of the first conductive structure or the second conductive structure.

14. The semiconductor arrangement of claim 13, comprising:

a second dielectric layer overlying the third conductive structure and the first dielectric layer.

15. The semiconductor arrangement of claim 14, wherein a sidewall of the second dielectric layer is adjacent a sidewall of the third conductive structure and a sidewall of the metal layer.

16. The semiconductor arrangement of claim 13, wherein the third conductive structure overlies a second portion of the metal layer that is not between the first conductive structure and the second conductive structure.

17. A method for forming a semiconductor arrangement, comprising:

forming a metal layer over an etch stop layer (ESL);

patterning the metal layer to generate a patterned metal layer, wherein a first opening is defined in the patterned metal layer;

patterning the ESL using the patterned metal layer to generate a patterned ESL;

forming a conductive layer in the first opening; and forming a first dielectric layer over the conductive layer, wherein a sidewall of the first dielectric layer is adjacent a sidewall of the conductive layer and a sidewall of the patterned metal layer.

18. The method of claim 17, comprising:

forming a second dielectric layer over the ESL prior to forming the metal layer; and patterning the second dielectric layer to generate a patterned second dielectric layer after patterning the metal layer and prior to patterning the ESL.

19. The method of claim 18, wherein:

the first opening is further defined in the patterned second dielectric layer and the patterned ESL, and forming the conductive layer comprises:

forming a first conductive structure in the first opening;

forming a second conductive structure in a second opening defined in the patterned metal layer, the patterned second dielectric layer, and the patterned ESL; and forming a third conductive structure over the first conductive structure, the second conductive structure, and a first portion of the patterned metal layer between the first conductive structure and the second conductive structure.

20. The method of claim 19, wherein comprising:

forming the first dielectric layer comprises forming the first dielectric layer over the third conductive structure and the second dielectric layer, and the sidewall of the first dielectric layer is adjacent a sidewall of the third conductive structure and a sidewall of a second portion of the patterned metal layer that is not between the first conductive structure and the second conductive structure.

* * * * *